United States Patent [19]

Bergmann

[11] 4,442,404
[45] Apr. 10, 1984

[54] METHOD AND MEANS FOR THE NONINVASIVE, LOCAL, IN-VIVO EXAMINATION OF ENDOGENEOUS TISSUE, ORGANS, BONES NERVES AND CIRCULATING BLOOD ON ACCOUNT OF SPIN-ECHO TECHNIQUES

[76] Inventor: Wilfried H. Bergmann, Lerchenweg 3, D-5483 Bad Neuenahr, Fed. Rep. of Germany

[21] Appl. No.: 326,344

[22] Filed: Dec. 1, 1981

Related U.S. Application Data

[63] Continuation-in-part of Ser. No. 103,227, Dec. 13, 1979.

[30] Foreign Application Priority Data

Dec. 19, 1978 [DE] Fed. Rep. of Germany ....... 2854774

[51] Int. Cl.³ ............................................. G01N 27/00
[52] U.S. Cl. .................................... 324/309; 324/315
[58] Field of Search ............... 324/300, 307, 309, 315, 324/318

[56] References Cited

U.S. PATENT DOCUMENTS 4,315,216 2/1982 Clow .................................. 324/309

OTHER PUBLICATIONS

P. Mansfield et al., Short Comm. Human Whole Body Line-Scan Imaging by NMR, Brit. Jour. of Radiology, No. 611, Nov. 1978, pp. 921,922.
J. MacKinnon, Variable Temperature X-Band EPR System with a Variable Cavity Coupler, Rev. Sci. Inst., vol. 43, No. 12, Dec. 1972, pp. 1847–1849.

*Primary Examiner*—Michael J. Tokar

[57] ABSTRACT

This invention relates to methods and means for improving the sensitivity and signal-to-noise ratio of spin-echo measurements on samples, which have to remain at their own temperature and which have a non-negligible electrical conductivity. These are applied to noninvasive, localized, in vivo examinations of endogeneous tissue, organs, bones, nerves and circulating blood in the course of medical check-ups as well as for differential diagnostics and for the validation of therapeutic measures. This equipment comprises a system of magnets and an arrangement of transmitting and receiving coils encompassing the test person (patient) preferably completely, but at least the region of exploration. Means for the excitation as well as specialized low temperature equipment for the detection of NMR-signals emanating from a very small subregion are provided.

5 Claims, 4 Drawing Figures

METHOD AND MEANS FOR THE NONINVASIVE, LOCAL, IN-VIVO EXAMINATION OF ENDOGENEOUS TISSUE, ORGANS, BONES, NERVES AND CIRCULATING BLOOD ON ACCOUNT OF SPIN-ECHO TECHNIQUES

This is a continuation-in-part application of U.S. patent application Ser. No. 103,227, filed Dec. 13, 1979.

BACKGROUND OF THE INVENTION

As of 1959, different techniques of Nuclear Magnetic Resonance (NMR) were being developed with respect to noninvasive, in-vivo methods for the observation and measurement of physiological processes and for diagnostics, for example, relating to hemodynamics. In 1968, NMR was for the first time applied to study the structure of intracellular water and the metabolism of cells; observations on extravasal water in myocardial and pulmonary tissue have been described in the study of cardiac infarction and pneumonoederma and a feasibility study for the diagnosis of ischemia has been reported. In 1971, application of NMR to cancer-research was initiated. Finally, in 1973 the development of various NMR-tomographic imaging processes, designated zeugmatography was originated. An article in "Nature", Vol. 270, p. 722 (1977) describes the achievement of a spatial resolution of $0.4 \times 0.4 \times 3.0$ mm$^3$. An X-ray computer tomogram of a human head is depicted in "Physics Today", Vol. 30/12, p. 32, December 1977. The NMR-zeugmatogram through a human radiocarpal joint, published simultaneous in the aforesaid article in "Nature" demonstrate comparable image qualities. Nevertheless about 100-times as much time (about 9 minutes) was required to accumulate the data for the latter.

One serious handicap of the above NMR-methods derives from having to take data at a signal-to-noise ratio much too close to one. Simultaneously, the observed volume has to encompass a much too large region of the sample for detailed and differentiated measurements. The described results may only be obtained by data accumulation and signal averaging techniques requiring an appreciable amount of time. A further uncertainty in the data during its accumulation is produced by a slightly shifting of the sample in reference to the observed control volume, due to involuntary movements, for instance, created by cardiac action or respiratory movement or the like. That all adds up to the described disadvantages of having to observe in much too large regions of the sample and of requiring time-consuming techniques for multiple data accumulation and signal averaging.

The radiation exposure of the patient quite often approaches the range of permanent damage (radiation entrance dose ≳3 rad) during examination involving X-rays, angiography, computertomography or nuclear medical diagnostics. This constitutes a serious obstacle in utilizing these methods for medical check-ups, for screening and even for the validation of the course of therapeutic measures.

SUMMARY OF THE INVENTION

It is therefore an object of the present invention to provide improved methods and means for executing spin-echo measurements on samples, which have to remain at their own temperature and which have a non-negligible electrical conductivity. These are to be accomplished within a very small sub-region of that sample, precisely localized, applying only one single pulse sequence, achieving high sensitivity and appropriate signal-to-noise ratio as well as high resolution in space and in time.

It is another object of the present invention to provide methods and means for obtaining the desired diagnostic information having to evaluate only one single pulse sequence applied to any specific region of exploration (control volume). This was possible up to now only by time-consuming data accumulation and signal averaging over a large number of individual measurements because of the much smaller signal-to-noise ratio obtainable.

The described task may be performed by an NMR apparatus equipped appropriately for the determination of the density of some specific nuclides (with non-zero magnetic moment) in any well defined and precisely localized control volume within the region of exploration. Said apparatus comprises means for the automatic control of the position of the very small control volume, in reference to involuntary movements within the subject. Furthermore, it comprises means for the determination of both of the relaxation times, that is the characteristic time $T_1$, known as the spin-lattice relaxation time as well as the spin-spin relaxation time, $T_2$. Further means are provided for the measurement of the components of the tensor of diffusion and for the evaluation of the contraction (transformation) of the spin-spin relaxation time due to the hydrodynamic state of circulating blood within the control volume. The apparatus in accordance with the present invention is furthermore characterized by a detection coil as well as the total primary detection system operating at very low temperatures, preferably in the superconducting state and, in particular, in the temperature region of superfluid helium below about 1.85 K.

The apparatus comprises, according to one preferred embodiment of this invention, an electromagnet and/or a super-conducting magnet system producing a homogeneous magnetic field, persisting extremely constant in time. It comprises furthermore magnet coils for the generation of slowly variable three-dimensional linear and/or quadratic or of higher order magnetic field gradients for confining and controlling the region of resonance, the control volume. The remote control of the position of the region of resonance is furthermore conducted via these field gradients by compensating for involuntary periodic subject movements under the influence of cardiac action, respiratory movements, peristalsis and the like. The fluid dynamic analysis is also performed via these gradient fields. The apparatus further comprises a coil system and associated control equipment for the generation of fast varying three-dimensional pulsed magnetic field gradients for the determination of the components of the diffusion tensor and under certain conditions for the execution of hydrodynamic analysis.

A gradiometer coil of first or second order design is arranged for signal detection in the interior of said apparatus in accordance with this invention, preferably coaxial in reference to the transmission coil. The detection system is equipped in this particular embodiment with a SQUID (superconducting quantum interference device) and/or a preamplifier operating at the above mentioned low temperatures.

The present invention is directed to an improved technique "for the noninvasive, localized examination of ... by spin-echo techniques". Spin-echo techniques are but one particular group of nuclear or gyromagnetic resonance experiments in which the sample (patient) is irradiated with radio frequency radiation at one time for excitation to reradiate a signal at a different later time (e.g. some microseconds later). This very circumstance sets up the opportunity for avoiding known problems and limitations such as are elaborated upon by D. I. Hoult and P. C. Lauterbur in J.Mag.Res. 34, 425 (1979). They attempt to demonstrate in particular that noise from the patient, set off by inductive losses during its rf-irradiation, will impede the reduction of noise within the primary detection system (especially within the detection coil). This is deffinitely not true if one separates the rf-irradiation sufficiently from the reradiation of the signal e.g. in time. The only possibility for improving the signal-to-noise ratio is to reduce the noise in the detection system, as the amplitude of the signal is limited by properties of the sample and requirements of geometrical resolution of the signal, which should emanate from preferably an as small as possible sub-region. All technical details described under preferred embodiments aim therefore at reducing the external und internal (Johnson) noise within the detection system in order to render signals measurable up to now not observable at all.

The principle of this invention is discovery and disclosure contrary to accepted teaching, of possibilities of lowering the noise level substantially.

To conduct by spin-echo techniques determinations of the density of nuclides, the relaxation times, and the components of the diffusion tensor is standard state-of-the-art (see e.g. T. C. Farrar and E. D. Becker: "Pulse and Fourier Transform NMR", Academic Press, N.Y. (1971)). Such measurements can be performed with much improved signal-to-noise ratio applying the disclosed techniques. Therefore, one can conduct these measurements also in much smaller sub-regions of the sample, i.e. more localized.

Up to now, different NMR-methods of determining the local density of nuclides with marginal signal-to-noise ratio yielded different NMR-imaging procedures, e.g., as shown by W. S. Moore et al. in U.S. Pat. No. 4,015,196 of Mar. 29, 1977, by A. N. Garroway et al. in U.S. Pat. No. 4,021,726 of May 3, 1977, by R. R. Ernst in U.S. Pat. No. 4,070,611 of Jan. 24, 1978, by P. Mansfield in U.S. Pat. No. 4,115,730 of Sept. 19, 1978 and by A. N. Garroway et al. in Journal of Physics C, vol. 7, no. 24, p. L 457 of Dec. 21, 1974. Some more specialized NMR-information is attempted to obtain without improved signal-to-noise ratio by R. V. Damadian in U.S. Pat. No. 3,789,832 of Feb. 5, 1974 and by Z. Abe et al. in U.S. Pat. No. 3,932,805 of Jan. 13, 1976. Somewhat improved attempts to obtain localized phosphorus spectra in-vivo were presented by T. R. Brown from Bell Labs. at the Vanderbilt NMR Imaging Symposium Oct. 26–27, 1980 and by Oxford Research Systems Topical Magnetic Resonance Spectroscopy. Both of these are attempting to improve signal-to-noise by observing more or less a complete organ, i.e. enlarging the signal emitting volume as much as possible. Up to that invention no attempt has been published to lower the noise-level in an in-vivo NMR-imaging experiment to such a degree that localized precision NMR-experiments, like phosphorus-spectra of something like a very small fraction of such an organ or blood flow analysis in a medium or small artery or vein in-vivo, should become feasible.

Taking NMR-spectra by pulse-techniques of samples, filling more or less the detection coil, is again state-of-the-art (see e.g. T. C. Farrar and E. D. Becker: "Pulse and Fourier Transform NMR", Academic Press, N.Y. (1971)).

It is known, that the sensitivity of NMR-measurements may be severely restricted by the conductivity of the sample. The electromagnetic rf radiation for the excitation of NMR induces eddy currents simultaneously in such a sample. These eddy currents contribute electromagnetic radiation which may compete with the one emanating from the sample due to the excited NMR. Therefore, simultaneous excitation of NMR and detection of its signal may be precluded. Only in spin-echo techniques one may let elapse sufficient time between the exciting rf pulse and the formation of the spin-echo within the sample for all other excitations to decay (relax) in the meantime. Thus only the NMR excitation will remain, as it is relaxing much more slowly. Among the faster decaying excitations are the inductive ones with their concomitant noise radiation. After their relaxation, they will not be able any more to compete with the signal from the spin-echo now under formation. Thus NMR signals unperturbed by "inductive noise" may be detected by the application of spin-echo techniques. The detection of spin-echoes has to compete under these conditions mainly with the thermal radiation according to Planck's law prevailing within the dewar vessel which encompasses the detector coil at low temperatures, which has to be designed preferably to perform as filter for electromagnetic radiation with an appropriate band-pass width around $\omega_o$ and the internal thermal (Johnson) noise within the detector coil. Both of these noise sources decrease at lower temperatures, yielding very favorable conditions at superfluid helium of about 1.85 K. Spin-echo measurements are performed at one particular frequency $\omega_o$ only. Further noise reduction in the detection of the spin-echoes may be accomplished by limiting the bandwidth of the detector, as done e.g. by the particular microwave circuit described later on. It becomes mandatory to screen off and to compensate for any magnetic and electromagnetic perturbations from the outside (in particular within that bandwidth) which may compete in strength (amplitude) with the spin-echoes to be detected.

The accomplished improvement in sensitivity and signal-to-noise ratio according to this invention are brought forth and characterized by:

(a) The detector coil system being designed in fashion of a first or second order gradiometer. It is therefore very insensitive to perturbing electromagnetic radiation from the surrounding (extraneous noise) but simultaneously highly sensitive to the internal, strongly inhomogeneous radiation field from the excited control volume.

(b) The entire primary detection circuit operating at very low temperatures in order to reduce its internal noise, preferably cooled below 1.85 K and thermally stabilized by superfluid helium.

(c) The detector coil system and the entire primary detection circuit (and if necessary the pertinent connecting lines too) being largely constructed either of ultra-high purity metals, like aluminum possessing an as large as possible resistance ratio; or, preferably, of appropriate superconductors and preferably of hard type II ones. These type II superconductors are selected preferably such, that the currents induced by spin-echo signals during the data acquisition time are conducted without dissipation in the "mixed state" and below the onset of "flux flow", as for instance is the case for $Nb_3Sn$.

(d) The transmission and the detection coil systems being decoupled, that may be achieved in one preferred embodiment for instance by arranging the gradiometer coil coaxial and symmetric in the central homogeneous designed area of the field of the transmission coil. Different kinds of appropriate arrangements are feasible too. In another preferred embodiment the detector coil may be constructed of appropriately thin superconducting films. These may be transradiated through by the field pulses of the transmission coil ($H_1$) and the fast gradient field pulses comprised for instance within the Carr-Purcell-Meiboom-Gill pulse sequence (see T. C. Farrar & F. D. Becker: "Pulse and Fourier Transform NMR", Acad. Press, N.Y. (1971)). In a further preferred embodiment of this invention the superconducting detector coil is being driven normal temporary by above field pulses that may be tolerated because of the thermo-stabilization of the detector coil with superfluid helium.

(e) The $H_0$-field being produced by an electro and/or superconducting magnet system preferably designed such that it conducts the return-flux of the $H_0$-field within a soft-ferro-magnetic yoke (the magnetic circuit connecting the pole faces) which is surrounding and encompassing the field space between pole-faces as much as possible on all sides. By these means, extensive screening off external electromagnetic and magnetic perturbations is being effected. For a perfect stabilization of the $H_0$-field its flux may be frozen in by an appropriately designed short-circuited superconducting magnet coil arranged inside of the excitation windings of said magnet system.

(f) Three mutually orthogonal pairs of superconducting short-circuited coils with a low number of windings being rigid attached to the outside of said yoke by non-magnetic supports in a fashion like Helmholtz-coils, such that the fluctuations of all external perturbation fields are compensated, especially during data acquisition times. The yoke and, appropriately, the $H_0$-field, experience by these means from the instant on, at which these coils went superconducting, merely the at that instant resultant external field, but entirely constant in time.

(g) The coordinates in space of two or more anatomically prominent points of reference, as for instance vascular bifurcations in the organ of exploration, may be identified by a characteristic appearance of their signal in time and in space by the concomitant current settings for the production of the three slowly variable magnetic field gradients defining the position in space of the resonance volume. Involuntary periodic body movements of that organ or within it may thus be surveyed as function of time and space. Such involuntary periodic body movements are being produced for instance by cardiac action, respiratory movement and peristalsis. An appropriate affine transformation as function of time is derived from these coordinate movements. Spin-echo information obtained at different instances in reference to said body movements is therefore either reduced in geometry by appropriate interpolation to any arbitrary selected time or is depicted arranged according to its sequence in time or both. The position of the control volume in space also may be remotely controlled via this transformation in accordance with these body movements. It is possible by these means to take observations or perform measurements or both at one anatomically precisely defined site for an extended time, as well as to compensate and eliminate or both the effects of uncertain or poor spatial definition due to involuntary periodic body movements.

(h) The coil systems, providing the $H_0$-, the $H_1$-, as well as both of the gradient fields and the detector coil system, operate at described very low temperatures, preferably in the temperature range of superfluid helium below about 1.85 K. Thus all of these coil systems may be integrated into one single mechanically rigid unit. This is done in order to avoid perturbation effects originating from relative mechanical motions between these coil systems, as for instance, originating from vibrations or natural frequencies. In particular, all coil systems generating and stabilizing the $H_0$-field and the detector coil system are operated in the superconducting state, while the transmitting coil system as well as both of the coil systems producing said field gradients are operated in the normal state of conduction being designed preferably out of ultra-high-purity metals, e.g. aluminum. One particular preferred embodiment for technical realization of such an integrated magnet system is being described e.g. in both of the U.S. Pat. Nos. 3,600,281 and 3,894,208, which describe techniques for moulding different coils into one rigid ceramic assembly permeable to superfluid helium (i) The superconducting primary detection circuit is enclosed with appropriate superconducting materials for electromagnetic shielding, with the exception of the gradiometer coil. The latter itself is short circuited and galvanically decoupled by an appropriate array of fast switching ($\geq 10^{-7}$s) thin film cryotrons (see Journal of Applied Physics, Vol. 30, p. 1458, 1959) during the transmission time of the individual $H_1$-pulses and of gradient field pulses.

(j) The spin-echos are received in an appropriate fashion by the gradiometer coil as transient electromagnetic wave-trains of the pertinent Larmor-frequency $\omega_o$ modulated in amplitude. These are coupled inductively by a flux-transformer into a microwave biased superconducting quantum intereference device (SQUID) system and are detected with an appropriately fast phase-sensitive detector in quadrature. Preferably a bias frequency in the range between one and a few hundred GHz are chosen as the amplitude of the output signal and the signal-to-noise ratio are increasing proportional to the pump frequency. These frequencies also yield flux transition times in the range of $10^{-12}$ sec/$\phi_o$. The SQUID will be operated reflective to guarantee the necessary band width and preferably in the non-hysteric mode tuned off resonance for achieving its maximum flux sensitivity, as described by P. K. Hansma in the Journal of Applied Physics 44/9, p. 4191 (1973).

Further understanding of the present invention may best be obtained from consideration of the accompanying FIG. 2 later on, which discloses the principles of such a system.

Whereas the information obtainable by X-rays is contained in the picture, one may perform in addition to that with the NMR-apparatus according to this invention at any desirable position being depicted specific instantaneous molecular measurements precisely localized and entirely noninvasive. The latter yielding additional differential diagnostic information for instance on the presence of some particular isotopes, on benign and malign structures of tissue, on cellular metabolism, on the bonding state of cellular water and on its hydration at proteins, on the viscosity of intracellular liquids (enchylema), up to a complete hydrodynamic analysis (volume-pressure-time-characteristics, state of flow, velocity distribution and variation of the flow cross section, all as functions of space and time) of blood pulsating in some particular vessel or in the heart.

The distinct advantages of these NMR-methods practiced in accordance with the present invention for biophysical and diagnostic applications are established: in one respect within their complete noninvasiveness, and on the other hand in the avoidance of any harmful (detrimental) consequences of the stationary and low frequency magnetic fields, as well as of the radio-frequency fields employed for examination. The rf-power absorption within the tissues amounts to about $10^{-7}$ to $10^{-9}$ W/cm$^3$. It is therefore a few orders of magnitude smaller than the one being administered by diathermic therapy. The NMR-methods practiced thus according to the present invention facilitate not only the performance of the described molecular structure and kinetic measurements instantaneously to be conducted at any desired location of the human anatomy, but also render the possibility of producing two- and three-dimensional tomographic charts of the distribution of all of these properties in the fashion of zeugmatograms.

BRIEF DESCRIPTION OF THE DRAWINGS

Further understanding of characteristics, advantages and possibilities for application of the present invention may best be obtained from consideration of the accompanying drawings which disclose, in schematic form, a preferred embodiment of the invention:

FIG. 1b is a drawing showing in the same view as depicted in FIG. 1a in a schematic fashion the arrangement and orientation of the different fields, produced by the coils of described equipment according to FIG. 1a.

DETAILED DESCRIPTION

Figure 1A:
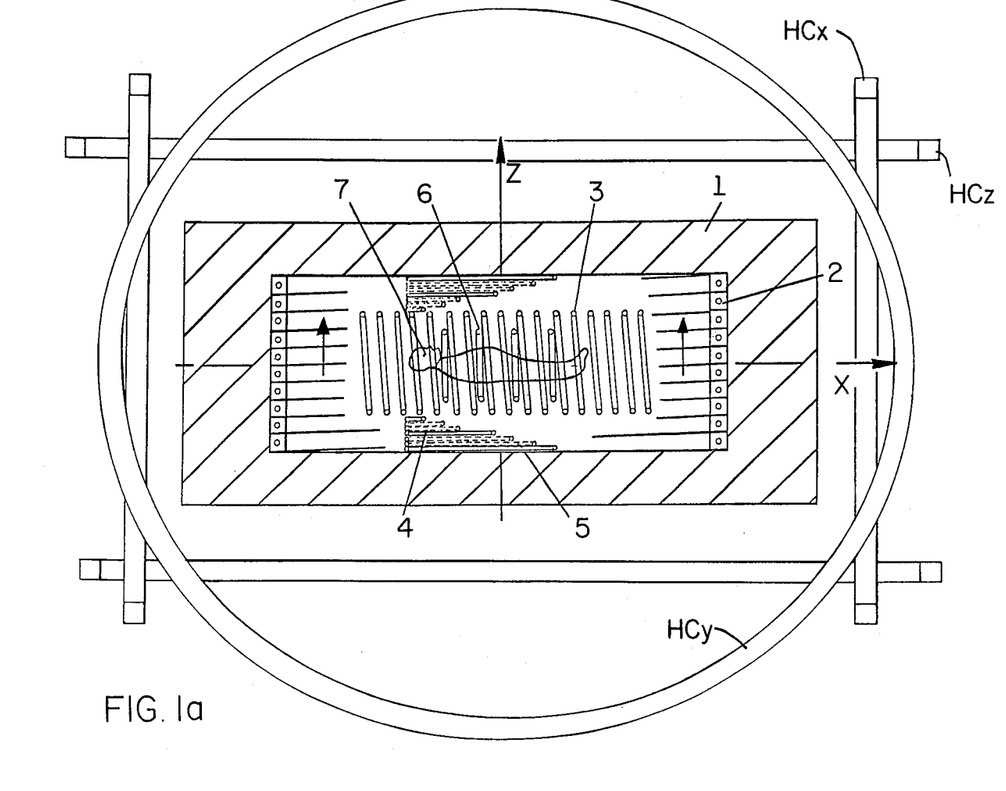
FIG. 1a is a drawing showing the cross-section of one preferred embodiment of the apparatus according to this invention.

To further understanding of the present invention, reference is made to FIG. 1a wherein is shown the arrangement of the different coils for the production of the individual fields in reference to the test person 7. The electromagnet, expediently is laid out as a superconducting system, for generation of the homogeneous magnetic field $H_0$ in z-direction 8 being extremely constant in time. Its yoke is designated with 1 and its excitation windings by 2. The internal superconducting magnet for the final field stabilization is not shown for preserving the clarity of the drawing. The external superconducting Helmholtz-coil system for the compensation of external field fluctuations are indicated by HCx, HCy and HCz. The coil systems 5 and 4 for the respective generation of the slowly variable field gradients in x-direction and for the fast field gradient pulses in x-direction are also indicated. The analogous coil systems for the production of the corresponding field gradients in the y- and z-directions are not shown for preserving the clarity of the drawing.

In that context, W. Anderson in U.S. Pat. No. 3,199,021 of Aug. 3, 1965 and F. A. Nelson in U.S. Pat. Nos. 3,406,333 of Oct. 15, 1968 and in 3,450,952 of June 17, 1969 and H. E. Weaver, Jr. in U.S. Pat. No. 3,577,067 of May 4, 1971 and G. D. Kneip, Jr. in U.S. Pat. No. 4,173,775 of Nov. 6, 1979 present methods for improving the spatial and/or temporal homogeneity of a magnetic field for high-resolution NMR spectrometers. Superior techniques for achieving the for the application wanted homogeneity and temporal constancy and unperturbedness from the outside are outlined by "the magnetic joke" of the electromagnet, being designated in FIG. 1a with 1, ". . . is designed preferably such, that it forms a field space enclosed as much as possible entirely on all sides", "somewhat alike an iron crate of sufficient wall thickness for the field return flux and the external noise flux", and by ". . . its flux may be frozen in by an appropriately designed, short circuited superconducting magnet coil arranged inside of the excitation windings of said magnet system". Such a superconducting magnet is kept normal until $H_0$ produced by the electromagnet has reached its operating field strength. When it becomes superconducting it "takes over" the encompassed flux shielding off by compensating currents all field alterations from the outside. An entirely superconducting equivalent magnet system is described in FIG. 1 of the German application No. P 29 51 018.7.

Figure 1B:
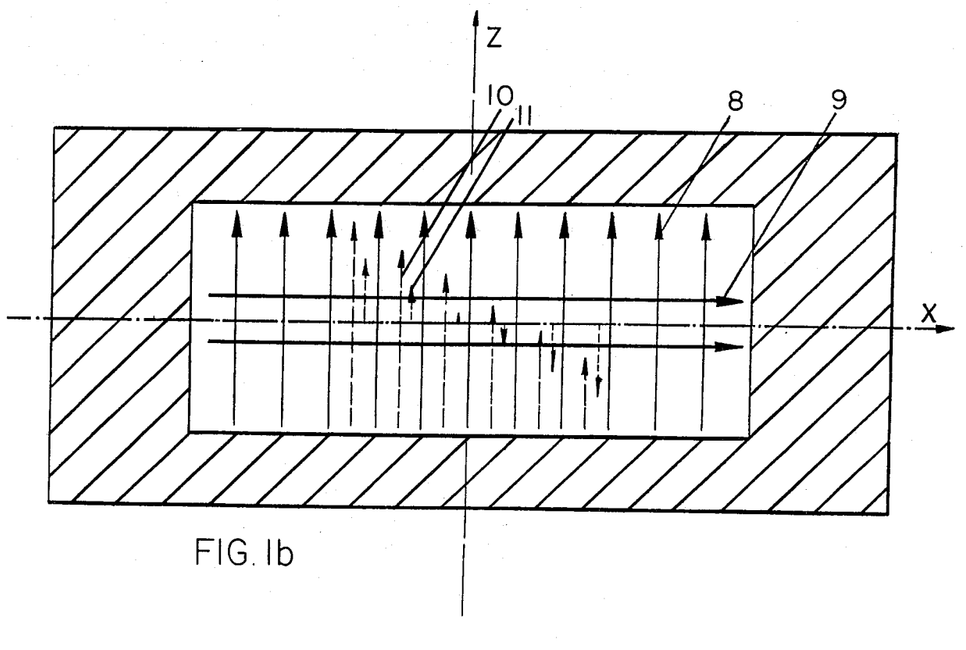

The operation of the Helmholtz like coils for the compensation of all fluctuations in external perturbation fields proceeds analogously to the operation of the superconducting internal magnet, stabilizing (freezing-in) the $H_0$ field. $H_1$ is being produced by means of an RF-transmission coil 3. Coils 5 and 4—compare FIG. 1a with 1b—are for generation of the slowly variable field gradients 11 and the fast field gradient pulses 10 in x-direction, respectively. The intended position of the test person 7 within the apparatus in accordance with this invention is indicated in FIG. 1a too. The control volume, the region of observation and measurement, happens to be at the origin of the coordinate system due to the depicted disposition of the slowly variable field gradient 11 at FIG. 1b.

A gradiometer coil 6, in this particular preferred embodiment of the second order, comprises four windings. This arrangement acts like switching in series two gradiometers of the first order in opposition. Three orthogonal small single turn loops are arranged outside the region of influence of both of the field gradients 10 and 11 appropriately switched in series with the gradiometer for compensation of any remaining sensitivity towards fluctuations of external homogeneous magnetic fields in spite of a fabrication employing highest precision. Their sensitivity may be adjusted from the outside by small coaxially movable superconducting shielding cylinders. An array of fast switching ($\approx 10^{-7}$s) thin film cryotrons A follows further on. It prevents any pick-up current from reaching into the SQUID during transmission times of $H_1$-9 and field gradient pulses 10. Simultaneously it terminates the gradiometer dissipative. Super-currents within the gradiometer system, induced by spin-echos during its receiving period (data acquisition), are coupled, preferably, inductively by a flux transformer into the SQUID-detector by the field transfer coil B which, preferably, is toroidally surrounding the weak link (Josephson junction) C, being realized for instance by an appropriate point contact. An as large as possible amplification should preferably be achieved within the flux transfer circuit. Neither the described compensator nor the superconducting screens (which are shielding all electromagnetic and magnetic fields off the flux transformer with exception of said four gradiometer windings and off the compensator) are shown in order to preserve the clarity of the drawing.

J. P. Wikswo, Jr. describes in U.S. Pat. No. 3,980,076 of Sept. 14, 1976 a very sensitive technique for slow magnetic susceptibility changes, i.e. a very low frequency technique in which the gradiometer is being used to differentiate between an external inhomogeneous signal and an external homogeneous noise, both of very low frequency. This measurement is not NMR at all. In this invention, the gradiometer is being used to differentiate between an internal inhomogeneous rf-signal and an external homogeneous noise as well as for eliminating any induction from the rf-pulses from the transmission coil. This is a novel application for a gradiometer.

Figure 2:
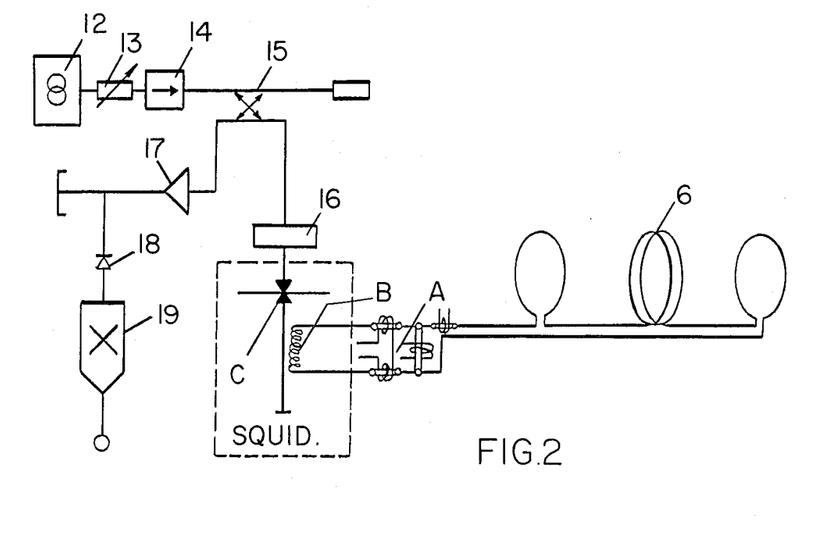
FIG. 2 is a drawing showing a block diagram of the detection circuit of the equipment according to FIG. 1a with a gradiometer-detector-coil.

Further on the detection circuit comprises essentially in accordance with FIG. 2 a microwave generator 12 (klystron or gunn-oscilaltor), supplying microwave power for instance in the range of $10^{-9}$W via an attenuator 13, an isolator 14, a directional coupler 15 or such as a Josephson junction, externally dc-biasing a complementary junction or such as a dc-SQUID and suitable amplification, for example, with a GaAs-FET and an appropriate impedance transformer 16 preferably as a near optimum taper (see "Applied Physics", vol. 14, p. 161,1977) to the SQUID. Its point contact preferably may be generated of an adjustable Nb-point against a Nb-flat anvil. The microwaves reflected from the SQUID may for instance be amplified by tunnel-diode amplifiers 17, then rectified by a Schottky diode 18 and detected by a phase sensitive detector 19 preferably in quadrature. All microwave components being at least plated on their inside with appropriate superconductors, but preferably being produced of such metals, like for instance Nb or $Nb_3Sn$, will be operated in accordance with this invention, with possibly the only exception of the generator 12, at temperatures within the range of their superconductivity but in particular at temperatures below 1.85 K, in order to reduce noise and thermal radiation effects to a minimum. The SQUID preferably operates in the non-hysteric mode tuned off resonance for achieving its maximum flux sensitivity. The compensation described in "Applied Physics", Vol. 14, p. 161 (1977) may be introduced into said microwave system in order to reduce system noise further on. The terminating impedances of this microwave system are at least refrigerated by helium vapor. The entire detection circuit is appropriately shielded from electromagnetic radiation by superconducting materials.

Figure 3:
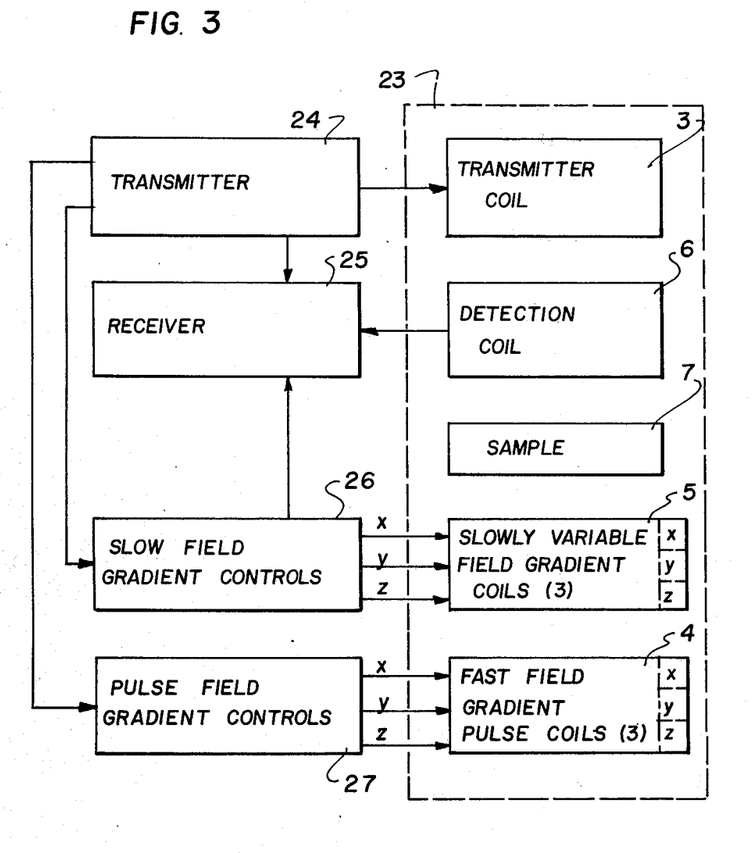
FIG. 3 is a drawing, showing a block diagram of the pulse-NMR-spectrometer.

The pulse-NMR-spectrometer is shown schematically in FIG. 3. The dashed line 23 comprises the probe, encompassing the rf transmission coil 3, the detection coil 6, the sample 7 (e.g. the test person or patient), three pairs of coils 5 for the generation of the slowly variable field gradients 11 and three pairs of coils 4 for the generation of the fast field gradient pulses 10; both in either of the three directions x, y and z of a Cartesian co-ordinate system indicated at FIGS. 1a and 1b, respectively. This probe 23 is exposed to the homogeneous, in space and in time constant magnetic field in z-direction 8. As in standard pulse-NMR-spectrometers, the sample is subjected to a sequence of rf-pulses of appropriate energy and duration, e.g. a Meiboom-Gill sequence as described in Rev. Sci. Intsr. 29, 688 (1958), from a standard rf-transmitter 24 via the transmission coil 3. The frequency of this rf radiation 9 is chosen with regard to the strength of the homogeneous field 8 in order to excite one desired magnetic resonance of one particular nuclide (e.g. protons or $p^{31}$) within the sample 7.

The probe 23 also contains an rf detection coil 6, e.g. a gradiometer coil, which will pick up the rf radiation (the spin-echos) emanating from that sample 7 due to above described excitation of NMR within that sample 7. This signal is amplified within rf receiver 25, whose pre-amplifier leading up to a phase sensitive detector 19 is shown in FIG. 2. A gating circuit which turns off the signal receiving during those periods when rf pulses or fast field gradient pulses are being transmitted is not shown in the drawing in detail.

The probe 23 also contains three pairs of coils 5 for subjecting the sample 7 to inhomogeneous magnetic fields 11, being slowly variable in space and time, superimposed on that homogeneous field 8. The variation in space and time of these gradient fields 11, operated by their control circuit 26, is such that but one particular chosen localized small volume remains unperturbed at the value of the homogeneous magnetic field 8 during one of the above mentioned rf pulse sequences and their concomitant spin-echo sequence. By these means the resonance signals (spin-echoes) being received are originating only from that localized unperturbed small volume of observation, being designated therefore as the control volume, the resonance volume or the "sensitive point". One particular method for operating such slowly variable field gradients is described by W. S. Hinshaw in J. Appl. Phys. 47/8, 3709 (1976).

Second and higher order field gradients are superimposed on that homogeneous field 8 instead of above linear field gradients by appropriately designed coils 5 in order to obtain a small but well defined volume of resonance, in particular having a small homogeneous field region at its center with edges at which the field changes rapidly. By these means it becomes feasible not only to apply the two-pulse $\pi/2$-$\pi$-pulse sequence to that resonance volume for obtaining one spin-echo from whose amplitude the spin density of some particular nuclide may be determined, e.g. the density of protons, $C^{13}$, $F^{19}$, $Na^{23}$ or $P^{31}$, respectively, within said resonance volume. One may also apply multiple pulse sequences alike above mentioned Meiboom-Gill sequence to that resonance volume for the determination of the relaxation times. By inverse convolution with the appropriate field function NMR-spectra can be derived from such relaxation measurements.

Furthermore, one may superimpose an appropriate linear field gradient, being constant in space and time for the duration of one multi-pulse sequence on above in space and time slowly variable higher order field gradients. By these means a resonance volume having such a linear field gradient in one particular direction of space results. This provides the opportunity for the determination of the diffusion coefficient in that direction by the application of a multi-pulse $\pi/2$-$\pi$-$\pi$- . . . sequence as described for instance by Carr and Purcell in Phys. Rev. 94, 630 (1954). By these means the components of the diffusion tensor may be determined too.

Furthermore, from the contraction (transformation) which above spin-spin-relaxation function, produced preferentially by a multi-pulse Meiboom-Gill sequence, experiences due to coherent flow within said resonance volume the hydrodynamic state of motion of that fluid may be determined, as explained later on.

Furthermore, a sequence of short, preferentially of linear field gradient pulses yielding a field gradient in some fixed direction of the space may be superimposed on the resonance volume having a small homogeneous field region at its center simultaneously with a Meiboom-Gill multi-pulse sequence in such a manner that the first field gradient pulse is interposed between the initial $\pi/2$-pulse and the first $\pi$-pulse and the following field gradient pulses are each interposed between $\pi$-pulses and spin-echoes in a fashion as described by Stejskal and Tanner in J. Chem. Phys. 42/1, 288 (1965). By these means improved diffusion and flow measurements may be conducted. This sequence of field gradient pulses of short duration is produced by the pulse field gradient controls 27 and superimposed by three sets of each two fast field gradient pulse coils 4.

The compensation of involuntary periodic motions within (of) the patient starts from the fact that the current settings within the 3 pairs of coils for the generation of the slowly variable field gradients in the x-, y- and z-direction, designated by 5 in FIG. 1a, are directly correlated with the position and the size of the sensitive volume, the resonance volume or the point of observation. The knowledge of these currents in regard to any particular object under observation is therefore a measure of the objects coordinates in reference to the magnet, their changes with time a measure of the objects motion. Such an object has to emit a characteristic signal by which its presence within the sensitive volume becomes known, e.g. a characteristic peaking of the signals amplitude e.g. whenever a certain vascular bifurcation passes through the sensitive volume. Observing such objects for some time one may establish the periodicity of their individual motion. From such information one may extrapolate for the position of that object at any wanted time in the near future and for the associated coordinates and current settings. Thus one may place the point of observation at a predetermined position to take a measurement at a certain predetermined time, when the object in its periodic motion just passes through that position.

In the event that the object under observation is conducting a complex periodic motion in space, e.g. the expanding and contracting heart, then one needs to record the periodic motions of more than one of e.g. four reference points in order to derive the necessary mathematical equations describing the periodic motion of some other particular point at which a desired NMR-measurement is to be taken. In principle it is always possible either to determine ahead ot time the time a certain point passes through predetermined coordinates in its periodic motion or to follow in time the periodic motion of such a point itself, if one has arrived at a description of its periodic motion. Thus compensation for or elimination of involuntary motions may be effected by the observation of such regions.

The medical significance of an apparatus operating in accordance with the present invention is not only due to the attainable improvement in the quality of pictures and in the resolution of tomograms (zeugmatograms) depicting the topography of organs, blood-vessels, nerves, tissue and bones as well as of tumors, carcinoma and their metastases, of angiograms for instance of the cardiocoronaries or cerebral vasculature by means of variations in the spin density of protons and by means of their bonding state yielding variations in their relaxation times. But also possibilities are being provided to study quantitatively on one single patient individual correlations on local variations in relaxation times with physiological and pathological findings, for instance, for an early differential diagnosis of diverse carcinoma. Analogous attempts have been conducted to diagnose pulmonary oedema (see "Clinical Research" 24/3, p. 217A (1976) and "Physics in Canada", vol. 32, p. 33.9 (1976)).

Furthermore, the feasibility for observing in very small regions relaxation times, diffusion and spectra, by inverse convolution of the appropriate field function with the relaxation function, is to be expected for invivo studies of the cyto-metabolism and the innervation of neurones due to the enhancement of the sensitivity and of the signal-to-noise ratio in consequence of the low temperatures applied in accordance with the present invention. Analogous experiments, most of them in-vitro, have been conducted not only on protons ($H^1$) but also on $H^2$, $H^{3L}$, $C^{13}$, $F^{19}$, $Na^{23}$ and $P^{31}$-nuclei (see "NMR in Biology", ed. R. A. Dwek et al., Academic Press (1977)). The possibility to determine from one single measurement in an appropriate arrangement the coordinates in space, thus the direction and distance in space from which the observed excited rf-radiation is emanating, and the strength and the orientation in space of the dipole being equivalent to said source of rf-radiation, will be of decisive advantage. This is being utilized for instance at the observation of the vector magnetocardiogram and the magneto-encephalogram. Such NMR-nuclei may make functional diagnostics appear feasible even in cases where a localization diagnostics does not produce any obvious pathological findings. Consequently, a diagnosis of osteoporosis appears feasible. This disease is characterized by a strong reduction of the volumetric density of the spongiosa in individual bones. Proceeding along with it is a strong local reduction on apatite $3Ca_3(PO_4)_2.Ca(Cl,F)_2$ within the diseased bones in comparison with healthy ones in the same patient. The local variations on apatite may be analyzed quantitatively with the aid of $F^{19}$ and $P^{31}$ density distributions. It would be very advantageous for observations to cellular metabolism if $K^{39}$ and $I^{127}$ and possibly $Li^7$ also coulbe be added to the above mentioned NMR-indicators. In other experiments observations were already made with the aid of $N^{15}$, $O^{17}$, $Al^{27}$, $Si^{29}$, $Cl^{35}$, $CD^{113}$, $Sn^{119}$ and $Pb^{207}$.

It has been demonstrated by means of $H^1$-, $C^{13}$- and $P^{31}$-NMR, the lipid-bilayer of biological membranes to be a fluid system yet with highly anisotropic diffusion characteristics. At present the protein-lipid-boundary-layer interactions applying sophisticated spin-echo pulse sequences are being studied (see "Physical Review", vol. 185, p. 420 (1969)) in order to gain some insight into their selective permeability and their biochemical and physiological functions as well as into the mitochondrial electron transport and nervous conduction (in-nervations). Investigations have been made with the aid of $P^{31}$-NMR-spectroscopy into the energy-transformation in physiological intact systems as for instance perfused muscles, heart or kidney by analysing the metabolism on hand of the catabolism (metabolite turnover) of ATP (adenosine triphosphate) in diverse "intact", "anoxic" and "ischaemic" conditions from the equilibria assumed (as a function of time) by the different metabolites as for instance phospho-creatine, inorganic phosphate, sugar phosphate and as of yet not identified resonances. The possibility of determining the hydrogen ion concentration (pH-value) within the cellular vicinity of the observed components by means of the applied NMR-methods have proved to be of particular advantage. The experiments with organs perfused by living animals has drawn attention to the possibility of performing with the equipment according to this invention on patients noninvasive in-vivo functional differential diagnostics of the metabolism of individual organs or of parts of it in order to diagnose dysfunction or cancer, or to observe the progress of an organ transplanation, or to validate the course of therapeutic measures with the aid of some pharmacon labeled by some particular NMR-indicator becoming effective and traceable locally in a particular organ.

The distinct differences in the relaxation times of circulating (flowing) blood and tissue create the possibility for generating not only NMR-tomographic pictures of the distribution of tissues within individual organs, as for instances, of the heart, or parts of the body as the head, but also of depicting their vascular systems such as in an angiogram.

With the equipment according to the present invention, the possibility exists of scanning the region of exploration in three dimentsions with the control volume. With appropriate information of that kind, for instance, an isometric projection of a three-dimensional angiogram may be constructed. Such could be a valuable tool for finding endangered areas of blood vessels, such as stenoses or aneurysms. That would be of particular value for an early diagnosis of arteriosclerosis. At these areas of such a blood vessel the in the following described hydrodynamic (fluid mechanics) measurements may be performed for arriving at a differential diagnosis of that circulatory disturbance. The same observations may be conducted for validation of therapeutic measures and medical screening and check-ups.

A further application of the apparatus in accordance with the present invention is based on recording the effluence-interferogram weighted by quantity of a spin population being Larmor-phase-coherent at the labeling time in an inhomogeneous magnetic field defined in space and time and belonging to a fluid discharging from its labeling field $H_1$ with differing velocities in a laminar or turbulent state of flow under stationary or pulsating conditions. That is an entirely novel technique for a complete hydrodynamic analysis of any streaming fluid, requiring no calibrations.

The NMR-experiment for the hydrodynamic analysis consists of a standard spin-spin relaxation determination by the application of a Meiboom-Gill-sequence (S. Meiboom and D. Gill: Rev. Sci. Instr. 29/8, 688 (1958)) to a flowing medium. This sequence is applied in the appended FIG. 2 to a stationary medium, while in FIGS. 1 and 3 the contraction transformation of the previous exponential decay brought about by the flowing medium is clearly visible. The initial amplitude of this signal is proportional to the number of the initially by the $\pi/2$-pulse labled spins, and therefore to the density of nuclides too. Its amplitude as function of time is proportional to the number of labeled spins still present at that particular time within the detection coil. An integral transform alike a Fourier transform displays the number of spins travelling at each velocity, the velocity spectrum ($m(v) \hat{=} dm/dv$ as function of v). Turbulence is detected from an analysis of an additional attenuation within that signal. The further evaluation of a single velocity spectrum as well as of a sequence of such in terms of its hydrodynamic information is explained further on.

By simple integration over this velocity spectrum is determined the initially the control volume occupying quantity of streaming fluid according to (with m the number of spins or the mass and v the velocity):

$$\int_{v_{min}}^{v_{max}} \frac{dm}{dv} \cdot dv = m$$

and the instantaneous mass flow rate (or analogous the instantaneous volume flow rate, the instantaneous within the unit of time through a certain cross section flowing blood volume) according to:

$$\int_{v_{min}}^{v_{max}} \frac{dm}{dv} \cdot v \cdot dv = \dot{m}$$

The instantaneous flow cross section or vascular cross section F follows accordingly:

$$F = \frac{\dot{m}}{\rho \cdot \bar{v}}$$

with $\rho$ the density of the blood and $\bar{v}$ its mean velocity, to be determined from the velocity spectrum.

Decisive for the evaluation of the transformed spin-spin relaxation function, diminished by the flow condition (hydrodynamic state) is the in-vivo measurement of the spin-lattice relaxation time of the blood circulating in the vessel under observation. Such may be derived from the attenuation of nutation pulses applied to the nuclear magnetization in adaptation of a method proposed by Zhernovoi and Latyshev in "Nuclear Magnetic Resonance in a Flowing Liquid", p. 132, Plenum Press (1965).

The hydrodynamics of the pulsatile circulating blood may be analysed by taking a sequence of rapidly each other succeeding spin-spin relaxation functions, yielding the instantaneous integral state of flow within observation times being short in comparison with 0.1 s therefore being independent of the transient motion of the observed fluid. The instantaneous velocity distributions as function of the pulsation yield the pulsating volume flow rate i of the circulating blood in the observed vessel. Its pulsating cross section F may be derived from these data as function of time. These again are yielding in turn the pulse wave rate $c_w$, the wave volume flow rate $i_w$ and the volume modulus of elasticity $\chi$ $$\chi = \rho \cdot c_w^2$$

The wave resistance, the impedance, $$Z = \frac{p_w}{i_w} = \frac{\rho \cdot c_w}{F_w}$$

establishes the absolute systolic pressure $$p_w = \frac{i_w \cdot \rho \cdot c_w}{F_w}$$

The wave volume flow rate $i_w$ is equivalent with the cardiac systolic discharge volume observing the aorta ascendens. Analogously the entire pressure-volume-time-characteristics of the heart (aorta) or any particular blood vessel may be determined in-vivo completely noninvasive from such a sequence of instantaneous integral state of flow measurements.

While specific embodiments of the inventions have been shown and described in detail to illustrate the application of the principles of the inventions, it will be understood that the inventions may be embodied otherwise without departing from such principles.

What is claimed is:

1. An apparatus for noninvasive, localized, in-vivo examination of tissue, organs, bones, nerves and circulating blood for the purpose of medical check-ups or of case control of therapeutic measures by means of spin-echo techniques of the type having a transmission and receiving coil system of a nuclear magnetic resonance equipment encompassing the test person completely, or at least that region of exploration, and means for detection and computation of the signals, comprising means for determining the density of nuclides with non-zero nuclear magnetic moment within a selected control volume, means for determining the spin-lattice relaxation time ($T_1$) and the spin-spin relaxation time ($T_2$), means for determining the components of the diffusion tensor ($D_{ij}$) and evaluating the contraction experienced by the spin-spin relaxation time ($T_2$) in consequence of the state of flow of blood within said control volume, a detection coil system, means for operating said detection coil system within the range of superconductivity below about 1.85° K., an electromagnet providing a homogeneous, with respect to time extremely constant magnetic field $H_0$, magnetic coils for the generation of slowly in time and space variable three dimensional linear and/or quadratic field gradients for confining and controlling the region of resonance into the control volume and for conducting a hydrodynamic analysis within said control volume and for the remote control of its position as a function of involuntary movements within the test person, another coil system for the production of fast three-dimensional magnetic field gradients pulses, a gradiometer detection coil of the first or second order for reduction of perturbations by exterior fields preferably arranged coaxially with respect to the transmission coil, and a microwave biased superconducting quantum interference device operative within the range of superconductivity.

2. The apparatus according to claim 1, wherein said electromagnet includes a magnetic yoke enclosing the gradiometer detection coil.

3. The apparatus according to claim 2, further comprising superconducting short-circuited coils being disposed like Helmholtz-coils outside said yoke for compensating all fluctuations of external fields effecting said yoke.

4. An Apparatus according to claim 1, further comprising a single mechanically integrated unit incorporating all the coil systems producing the $H_0$-, the $H_1$- and both of the gradient fields as well as the detector coil systems operating at said low temperature within the region of superconductivity, but only the coils producing and stabilizing $H_0$ and the detector coil being superconducting for the elimination of perturbations produced by mechanical relative motions of the different magnet systems in reference to each other as for instance vibrations and natural oscillations.

5. A nuclear magnetic resonance apparatus for the determination of the density of specific nuclides with non-zero magnetic moment in a control volume of a period to be tested for the noninvasive, localized, in-vivo examination of tissue, organs, bones, nerves and circulating blood for the purpose of medical check-ups or of case control of therapeutic measures by means of spin-echo techniques of the type having a transmission and receiving coil system encompassing the test person completely, or at least the region of exploration, and means for the detection and computation of signals, comprising gradiometer coil means for detecting nuclear magnetic resonance signals emanating from the control volume, a transmission coil for exciting the control volume coaxially surrounding said dgradiometer coil means, first magnet coil means operative at superconducting temperatures to generate slowly variable three-dimensional magnetic field gradients for confining and controlling the region of resonance into the control volume, second magnet coil means operative at superconducting temperatures to generate fast varying three-dimensional pulsed magnetic field gradients for the determination of the components of the diffusion tensor, electromagnetic means disposed about said gradiometer coil means operative to generate a constant homogeneous magnetic field for shielding said gradiometer coil means, said transmission coil, and said first and second magnetic coil means from external electromagnetic perturbations, a superconducting quantum interference device, a field transfer coil operatively connecting said gradiometer, coil means and said superconducting quantum interference device, and microwave generator means for biasing said superconducting quantum interference device.

* * * * *